United States Patent
Song et al.

[11] Patent Number: 6,166,969
[45] Date of Patent: Dec. 26, 2000

[54] METHOD AND APPARATUS FOR A LEVEL SHIFTER FOR USE IN A SEMICONDUCTOR MEMORY DEVICE

[75] Inventors: Byoung-Cheol Song, Youngin; Hak-Soo Yu; Kwang-Jin Lee, both of Seoul, all of Rep. of Korea

[73] Assignee: Samsung Electronics, Co., Ltd., Suwon, Rep. of Korea

[21] Appl. No.: 09/345,582

[22] Filed: Jun. 30, 1999

[30] Foreign Application Priority Data

Jun. 30, 1998 [KR] Rep. of Korea ............... 98-25610

[51] Int. Cl.[7] .................................................. G11C 7/00
[52] U.S. Cl. .................... 365/189.11; 365/233; 365/207
[58] Field of Search ..................... 365/189.11, 189.12, 365/189.09, 207, 196, 191, 233, 189.08

[56] References Cited

U.S. PATENT DOCUMENTS

| | | | |
|---|---|---|---|
| 4,618,785 | 10/1986 | van Tran | 307/530 |
| 5,113,097 | 5/1992 | Lee | 307/475 |
| 5,467,313 | 11/1995 | Jung et al. | 365/189.11 |
| 5,528,173 | 6/1996 | Merritt et al. | 326/80 |
| 5,739,726 | 4/1998 | Ling | 331/57 |
| 5,896,045 | 4/1999 | Siegel et al. | 326/81 |
| 5,936,428 | 8/1999 | Merritt et al. | 326/81 |
| 5,959,902 | 9/1999 | Fontana et al. | 365/189.11 |

Primary Examiner—David Nelms
Assistant Examiner—Thong Le
Attorney, Agent, or Firm—Marger Johnson & McCollom, P.C.

[57] ABSTRACT

Disclosed is a level shifter that can receive and convert a first signal that can have various voltage logic levels to a second signal having internal voltage logic levels. The level shifter includes first and second ascending/descending circuits, where the first ascend/descending circuit receives the first signal and the second ascend/descending circuit receives an inverted first signal. Each ascend/descending circuit is operable to descend a high logic level of the received signal to a low output voltage level and ascend a low logic level of the received signal to a high output voltage level. The output voltages from the first and second ascending/descending circuits are input to a sense amplifier that amplifies the difference between the output voltages in order to generate the internal voltage logic levels of the second signal. The first and second ascending/descending circuits buffer their respective received signals using the high logic level of the input signal as a supply voltage. The same principles are also applicable to the level shifting from internal voltage logic levels to external voltage logic levels.

65 Claims, 8 Drawing Sheets

METHOD AND APPARATUS FOR A LEVEL SHIFTER FOR USE IN A SEMICONDUCTOR MEMORY DEVICE

CROSS REFERENCE TO RELATED APPLICATIONS

This application claims priority from Korean Priority Document No. 98-25610, filed on Jun. 30, 1998 with the Korean Industrial Property Office, which document is hereby incorporated by reference.

BACKGROUND OF THE INVENTION

1. Field of the Invention

The present invention relates to a level shifter, and more particularly to a level shifter that can receive and convert signals with various voltage level types to signals with a normalized voltage level.

2. Description of the Prior Art

A level shifter is a circuit that converts an input signal from one voltage logic level to another voltage logic level. For example, the shifter can convert a CMOS logic level signal into a TTL logic level signal and vice versa. A conventional level shifter is typically able to convert a signal of a certain logic level type to a signal of another logic level type. However, a conventional level shifter is not able to convert a signal that may have one of many different logic level types to a signal of another logic level type.

Level shifters are often used to interface between a semiconductor memory device and devices external to the memory device. In other words, the conventional semiconductor memory device is equipped with a level shifter in case the logic levels of externally input signals are different from the voltage levels of internal logic levels within the memory device. The level shifter converts the voltage logic levels of external signals into signals having the internal logical voltage levels. These kinds of level shifters typically consist of sense amplifiers that are connected to each signal input terminal of the memory device and convert the voltage logic levels of the externally input data signals, address signals, control signals and clock signals into internal voltage logic levels.

When the level of the external signal is fixed at one level, the voltage logic levels of these signals can be correctly amplified and outputted. But when the voltage logic levels of the external signal can vary among several voltage logic level types, then the voltage logic levels of these signals cannot be correctly amplified and outputted. This is due to the fact that an amplifier is typically designed to amplify voltage logic levels of one particular logic type. The conventional semiconductor memory device, therefore, can only amplify and convert the levels of external signals to the internal voltage levels when the voltage logic levels of the external signals are of one particular logic type.

In order for the conventional semiconductor memory device to amplify input signals of multiple voltage logic level types and convert them to internal voltage logic levels, the device is equipped with a sense amplifier designed to produce signals of the correct internal voltage levels in response to external signals that can have multiple voltage logic levels. Such a sense amp is typically equipped with a switch for selecting one of several sense amplifiers to operate according to the voltage logic levels of the external signal. The structure of the resulting circuit can be quite complex.

For example, a level shifter for the clock signal generating circuit of a conventional synchronous type semiconductor device will receive an external clock signal or inverted clock signal. The level shifter will amplify the voltage logic levels of the clock signal in order to generate clock signal levels having the appropriate internal high and low logic levels. The level shifter amplifies the voltages of the high and low levels of the clock signal and outputs the resulting amplified signal to the clock signal generating circuit. The clock signal generating circuit will then generate an internal clock signal in response to the signal output by the level shifter.

However, if the levels of the external clock signal vary among multiple voltage logic levels, then it is difficult for the sense amplifier to operate and convert the various voltage levels of the external clock signals.

In other words, a sense amplifier of a level shifter can be designed to generate the appropriate internal logic levels from a clock signal having a LVTTL (low voltage transistor—transistor logic) level, where a low logic level is 0V and a high logic level is 3.3V. Problems arise, however, because the sense amplifier cannot also correctly generate the appropriate internal logic levels from a clock signal changing having a HSTL (high speed transistor logic) level, where a low logic level is 0V and a high logic level is 1.5V. However, when additional sense amplifiers are included in the design in order to correctly shift multiple voltage levels for the input clock signal, then the circuit becomes quite complicated.

Below is an explanation of a conventional level shifter and the semiconductor memory device used with it.

FIG. 1 illustrates a conventional level shifter circuit. The level shifter shown in FIG. 1 includes a PMOS transistor P2 having a source coupled to a source voltage VDD. PMOS transistor P1 has a source connected to the drain of PMOS transistor P2 and a gate that receives an inverted signal XDIB. PMOS transistor P3 has a drain connected to the output terminal DO, a gate that receives a signal XDI, and a source connected to the drain of the PMOS transistor P2. NMOS transistor N1 has a source connected to a ground voltage terminal, and gate and drain terminals that are both connected to the drain of PMOS transistor P1 and the gate of PMOS transistor P2. NMOS transistor N2 has a source connected to the ground voltage tenninal, a gate connected to the gate of PMOS transistor P2 and the gate of NMOS transistor N1, and a drain connected to the drain of PMOS transistor P3.

The structure of the level shifter shown in FIG. 1 is that of a sense amplifier. When signal XDI and inverted signal XDIB are 0V and 3.3V, respectively, and the source voltage VDD is 3.3V, then PMOS transistor P3 becomes turned on more than PMOS transistor P1 and the output voltage at terminal DO becomes 3.3V. Conversely, when signal XDI and inverted signal XDIB are 3.3V and 0V, respectively, and the source voltage VDD is 3.3V, then PMOS transistor P1 becomes more turned on than PMOS transistor P3 and the output signal at terminal DO becomes 0V. In other words, the level shifter shown in FIG. 1 can, when the voltage logic level of the input signal is 3.3V, amplify the difference and correctly generate the appropriate signal levels at output terminal DO of 0V and 3.3V. But if the voltage logic levels of the signal being inputted is either larger or smaller than these voltage levels, then the level shifter cannot correctly amplify and generate the appropriate voltage logic levels in the output signal at DO.

FIG. 2 shows a block diagram of a semiconductor memory device that uses the level shifter shown in FIG. 1. The memory device includes an address input buffer 10, a data input buffer 12, a control signal input buffer 14, a clock signal input buffer 16, a control signal generating circuit 18, a pulse generating circuit 20, a memory cell array 22, a row address decoder 24, a write driver 26, a column address decoder 28, a sense amplifier 30, and a data output buffer 32.

In the circuit shown in FIG. 2, the address input buffer 10, the data input buffer 12, the control signal input buffer 14, and the clock signal input buffer 16 are constructed using level shifters. In other words, address input buffer 10 is composed of a x level shifters, data input buffer 12 is composed of y level shifters, control signal input buffer 14 is composed of k level shifters, and data output buffer 32 is composed of z level shifters.

The address input buffer 10 outputs x address signals by buffering each of the input signals XAx. In other words, the address input buffer converts the voltage logic levels of external signals XAx to internal voltage logic levels and outputs them. The data input buffer 12, the control signal input buffer 14 and the clock signal input buffer 16 buffer and output data input signals XDy, control signals XCk, and clock signal XCK, respectively.

As for the clock signal input buffer 16, when the clock signal or a inverted clock signal is externally input, the appropriate clock signal can be directly inputted and buffered without the generation of a inverted clock signal by internally inverting the clock signal. Pulse generating circuit 20 then generates an internal clock signal ICK having the appropriate internal voltage level from the buffered clock signal received from clock signal input buffer 16.

The control signal generating circuit 18 generates an internal control signal IC by buffering the external control signal XCk received by control signal input buffer 14. The control signal IC is used to control write driver 26, sense amplifier 30, and data output buffer 32 during write or read operations.

Memory cell array 22 is composed of cells that store data transmitted from a bit line pair within the array during a write operation. During a read operation, the data stored in the cells is transmitted to the bit line pair. The row address decoder 24 decodes the line addresses buffered by the address input buffer 10 and generates word line selection signals WL1, WL2, . . . , WLn.

The write driver 26, during a write operation, transmits the data buffered by data input buffer 12 onto the data line pair DL and DLB which are connected to bit line pairs of memory cell array 22. The data line pair DL and DLB are also connected to sense amplifier 30 that receives and amplifies the data transmitted to the data line pair during a read operation. The sense amplifier outputs the amplified data received from the memory cell array to output buffer 32. Output buffer 32 buffers the data received from sense amplifier 30 and outputs the data from the memory device via z external output data lines XDOz.

As shown in FIG. 2, the conventional semiconductor memory device utilizes a level shifter structure composed of a sense amplifier in order to construct input and output buffers.

Thus, the memory device can only convert between internal voltage logic levels and the voltage logic levels of external signals having a single logic level type.

For example, if the low logic level of the externally input signal is 0V and the high logic level is 1.5V while the internal low logic level of the source voltage is 0V and the internal high logic level is 3.3V, then the voltage levels of the external signals can be amplified and outputted as the internal voltage levels. However, if the external low logic level is 0V and the external high logic level is 1.5V, while the internal low logic level is 0V and the internal high logic level is 2.5V, then the voltage levels of the external signals cannot be correctly amplified and converted to the internal voltage levels.

Therefore, if the voltage levels of the external signals change, then the sense amplifiers within the level shifters of conventional semiconductor memory devices cannot correctly amplify and convert between the external voltage logic levels and the internal voltage logic levels.

SUMMARY OF THE INVENTION

The object of the present invention is to provide a level shifter that can convert input signals of various voltage logic levels into signals of a regular voltage logic level.

Another object of the present invention is to provide a semiconductor memory device that uses a level shifter to accomplish the object above.

To accomplish the object, the present invention provides a level shifter comprising first and second level ascending/descending means for outputting first and second output signals by descending the high logic level of an input signal and a inverted signal and by ascending the low logic level after an input signal and a inverted input signal are respectively inputted; and sense amplifying means for amplifying the level difference between the first and second level ascending/descending means and for generating a third output signal with a fixed level.

Furthermore, the present invention provides a level shifter comprising level ascending/descending means for generating a first output signal by descending the high logic level of the input signal and by ascending the low logic level after the input signal is inputted; and sense amplifying means for generating a second output signal of a regular level by amplifying the level difference of the first output signal of the level ascending/descending means and a reference voltage.

The present invention provides a semiconductor memory device comprising a plurality of signal input terminals having a level shifter.

The present invention provides a semiconductor memory device having a plurality of signal input terminals, wherein the signal input terminals is composed of first and second level ascending/descending means for outputting the first and second output signal by descending the high logic level of the input signal and the inverted input signal and by ascending the low logic level after the signal being inputted from outside and the inverted signal of the signal are inputted. The input terminals further include sense amplifying means for generating a third output signal of a regular level after amplifying the level difference of the first and second output signals of the first and second level ascending/descending means.

The present invention provides a semiconductor memory device having a plurality of signal input terminals and a plurality of signal output terminals, wherein each of the signal input terminals includes: first and second level ascending/descending means for generating first and second output signals by descending the high logic level of the input signal and the inverted input signal and by ascending the low logic level after the signal being inputted from outside and a inverted signal of the signal are respectively inputted; and sense amplifying means for generating a third output signal of a regular level by amplifying the level difference of the first and second output signals of the first and second level ascending/descending means, wherein each of the signal output terminals includes: third and fourth level ascending/ descending means for generating fourth and fifth output signals by descending the high logic level of the third output signal and by ascending the low logic level after a third output signal being inputted from the device and a inverted third output signal are inputted; and sense amplifying means for generating a sixth output signal of a regular level by amplifying the level difference of the fourth and fifth output signals of the third and fourth level ascending/descending means.

The present invention provides a semiconductor memory device having a plurality of signal input terminals, wherein each of the signal input terminals includes: level ascending/descending means for generating a first output signal by descending the high logic level of the input signal and by ascending the low logic level after an input signal is inputted; and sense amplifying means for generating a second output signal of a regular level by amplifying the level difference of the first output signal of the level ascending/descending means and a reference voltage.

The present invention provides a semiconductor memory device having a plurality of signal input terminals and a plurality of signal output terminals, wherein each of the signal input terminals includes: first level ascending/descending means for generating a first output signal by descending the high logic level of the input signal and by ascending the low logic level after an input signal is inputted; and first sense amplifying means for generating a second output signal of a regular level by amplifying the level difference of the first output signal of the first level ascending/descending means and a first reference voltage level, wherein each of the signal output terminals includes: second level ascending/descending means for generating a third output signal by descending the high logic level of a second output signal being outputted from the device and ascending the low logic level; and second sense amplifying means for generating a fourth output signal of a regular level by amplifying the level difference of a third output signal being outputted from the second level ascending/descending means and a second reference voltage level.

DETAILED DESCRIPTION OF THE PREFERRED EMBODIMENT

Figure 3:
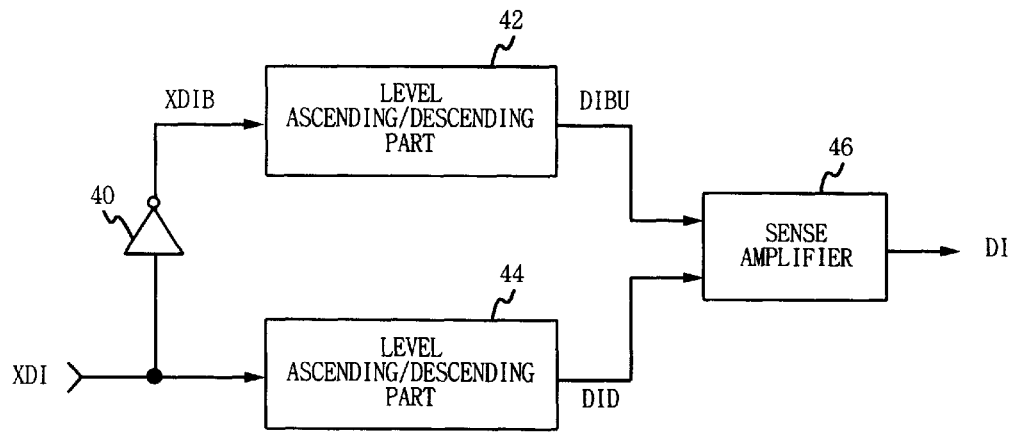
FIG. 3 shows a block diagram of a first embodiment of a level shifter according to the present invention.

FIG. 3 shows a block diagram of a level shifter according to the present invention, and it includes an inverter 40, level ascending/descending parts 42 and 44, and a sense amplifier 46.

The inverter 40 inverts a signal XDI and generates an inverted signal XDIB. If the inverted output signal XDIB of the inverter 40 and the signal XDI are at a high logic level, then the level ascending/descending parts 42 and 44 descend to a voltage level lower than the high logic level of the signal XDI. If they are at a low logic level, then parts 42 and 44 ascend to a higher voltage level than the low logic level of the signal XDI in order to generate signals DIBU and DID. The sense amplifier 46 amplifies the difference between the signals DIBU and DID and generates an input signal DI.

In the level ascending/descending parts 42 and 44 shown in FIG. 3, when the difference between the high logic and low logic levels of the signal XDI vary, then the function of converting these voltage logic levels of the XDI signal to the logic levels of the internal DI signal will have an almost fixed voltage level difference. In addition, the sense amplifier 46 receives and amplifies signals that have almost fixed voltage levels in order to generate signal DI.

Figure 4:
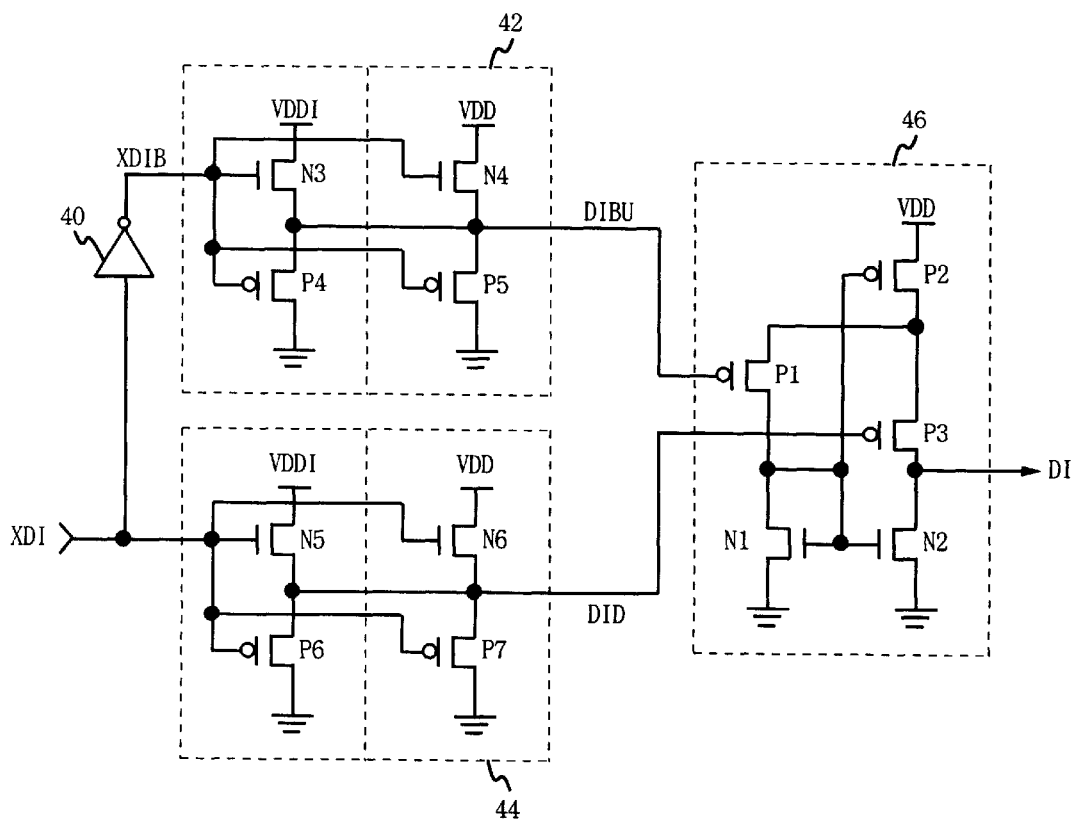
FIG. 4 shows a circuit of the level shifter shown in FIG. 3.

FIG. 4 shows an embodiment of the circuit of the level shifter shown in FIG. 3.

The level ascending/descending part 42 is composed of NMOS transistors N3 and N4 and PMOS transistors P4 and P5. The level ascending/descending part 44 is composed of NMOS transistors N5 and N6 and PMOS transistors P6 and P7. As can be seen from comparing FIG. 1 and FIG. 4, the sense amplifier 46 is constructed in almost the same manner as the sense amplifier in FIG. 1. Although the structure of the level ascending/descending parts 42 and 44 is the same, the level ascending/descending part 42 receives and converts the inverted signal XDIB while the level ascending/descending part 44 receives and converts the signal XDI.

The level ascending/descending part 42 is composed of NMOS transistor N3 having a drain coupled to supply voltage terminal VDDI, where VDDI receives the same supply voltage as the input signal DI, and a gate that receives inverted signal XDIB. NMOS transistor N4 has a source that is connected to the output terminal DIBU and a source of NMOS transistor N3; a drain that is connected to internal supply voltage terminal VDD; and a gate that receives inverted signal XDIB. PMOS transistor P4 has a drain that is connected to a ground voltage supply terminal; a gate that receives inverted signal XDIB; and a source that is connected to the source of NMOS transistor N3. PMOS transistor P5 has a drain connected to the ground voltage terminal; a gate that receives inverted signal XDIB; and a source connected to the source of NMOS transistor N4.

Additionally, the ground voltage is applied to the bulk substrate in which the NMOS transistors N3, N4, N5 and N6 are formed. Further, the internal supply voltage is applied to the bulk substrate in which the PMOS transistors P4, P5, P6 and P7 are formed.

Figure 5:
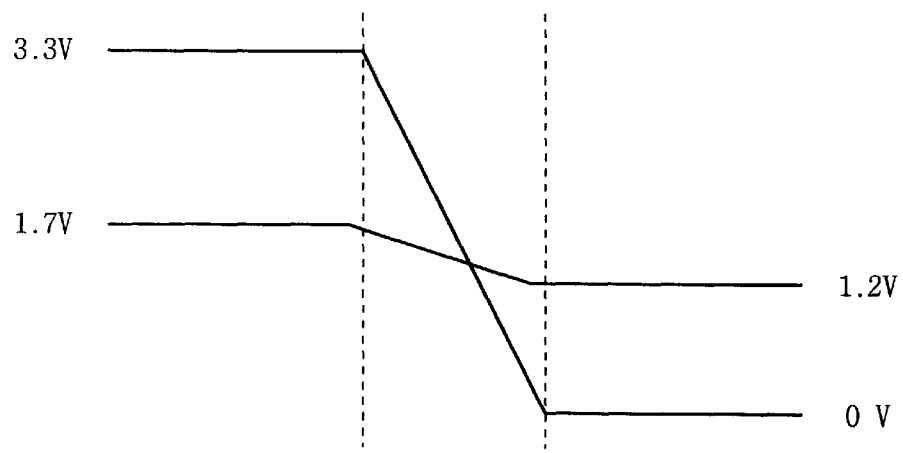
FIGS. 5 through 7 are views for the explanation of the operation of the level shifter, and show the results obtained from experiments.
Figure 6:
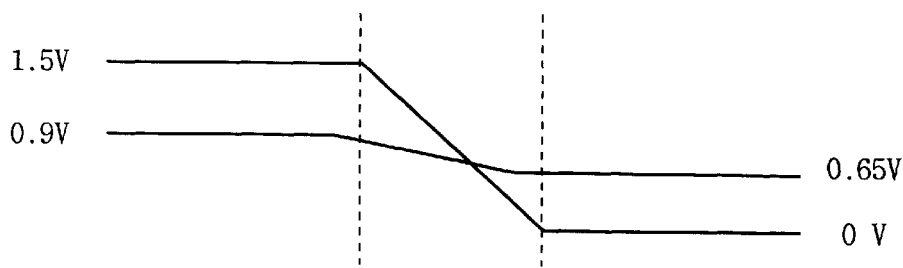
Figure 7:
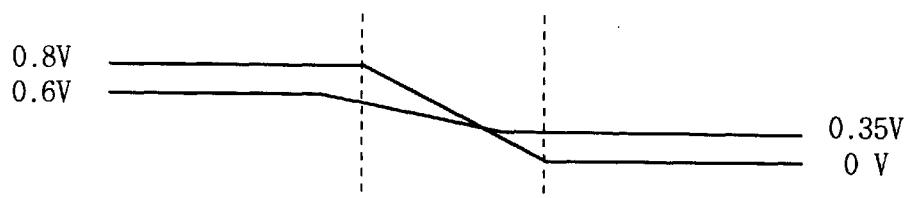

FIGS. 5 through 7 are voltage diagrams that illustrate the operation of the level shifter shown in FIG. 4 and show the level conversion values obtained from experiments.

Following is an explanation of the operation of the level shifter of the present invention, as shown in FIG. 4, using FIG. 5, when the high logic level of the input signal XDI is 3.3V, the low logic level is 0V, and the internal supply voltage is 3.3V. 3.3V is applied to the supply voltage terminal VDD of the level ascending/descending parts 42 and 44 of FIG. 4, and another 3.3V external supply voltage is applied to the supply voltage terminal VDDI. The operation of the level ascending/descending part in this case can be described by the mathematical formula below, where the threshold voltage Vth of the MOS transistor is as follows:

$$Vth = Vtho + \sqrt{\gamma(\Phi - |V_{BS}|)} - \sqrt{\Phi}$$

where Vtho represents the threshold voltage when $V_{BS}$ is 0, γ represents a bulk threshold parameter, Φ represents the strong inversion surface potential, and $V_{BS}$ represents the bulk-source voltage.

When 3.3V is applied to the gates of NMOS transistors N3 and N4 and PMOS transistors P4 and P5 of the level ascending/descending part 42 of FIG. 4, then PMOS transistors P4 and P5 turn off and the NMOS transistors N3 and N4 turn on. As a result, the voltage generated by NMOS transistors N3 and N4 is outputted as output signal DIBU. The output signal DIBU reaches a voltage level obtained by subtracting the threshold voltage of NMOS transistor N4 from 3.3V. The threshold voltage is determined using the formula above and yields an output voltage level of about 1.8V and results in a high logic level of the output voltage DIBU of about 1.7V.

When 0V is applied to the gates of NMOS transistors N3 and N4 and the PMOS transistors P4 and P5 of the level ascending/descending part 42, then NMOS transistors N3 and N4 turn off and the PMOS transistors P4 and P5 turn on. As a result, the output voltage drops, but does not drop to 0V at this time. It drops to the threshold voltage of the PMOS transistors P4 and P5 and the output voltage becomes about 1.2V, as shown in FIG. 5.

FIG. 6 illustrates the operation of the level shifter, according to the present invention, when the high logic level of the input signal D is 1.5V, the low logic level is 0V, and the internal supply voltage at VDD is 2.5V. 2.5V is applied to internal supply voltage terminal VDD of the level ascending/descending parts 42 and 44 of FIG. 4. At the same time, 1.5V is applied to the external supply voltage terminal VDDI. The operation of the level ascending/descending part 42 in this case is explained below.

When 1.5V is applied to the gates of NMOS transistors N3 and N4 and PMOS transistors P4 and P5 of the level ascending/descending part 42 of FIG. 4, then PMOS transistors P4 and P5 turn off and the NMOS transistors N3 and N4 turn on. The output voltage at DIBU is determined by the threshold voltage of the NMOS transistor N4 subtracted from 1.5V according to the formula above. The resulting threshold voltage is about 0.6V. As a result, the high logic level of the output voltage signal DIBU becomes about 0.9V, as shown in FIG. 6.

When 0V is applied to the gates of NMOS transistors N3 and N4 and PMOS transistors P4 and P5 of the level ascending/descending part 42, then NMOS transistors N3 and N4 turn off and the PMOS transistors P4 and P5 turn on. As a result, the output voltage drops, but does not drop to 0V. It drops to the threshold voltage of the PMOS transistors P4 and P5, and the output voltage becomes about 0.65V, as shown in FIG. 6.

FIG. 7 illustrates the operation of the level shifter, according to the present invention, when the high logic level of the input signal XDI is 0.8V, the low logic level is 0V, and the internal supply voltage at VDD is 1.5V. 1.5V is applied as the supply voltage for the level ascending/descending parts 42 and 44 of FIG. 4 and 0.8V is applied as the external supply voltage to VDDI. The resulting operation of the level ascending/descending part 42 in this case is explained below.

When 0.8V is applied to the gates of NMOS transistors N3 and N4 and PMOS transistors P4 and P5 of the level ascending/descending part 42 of FIG. 4, then PMOS transistors P4 and P5 turn off and the NMOS transistors N3 and N4 turn on. As a result, the output voltage at DIBU reaches a voltage obtained by subtracting the threshold voltage of the NMOS transistor N4 from 0.8V. The threshold voltage is decided using the formula above and results in a threshold voltage of about 0.2V. Consequently, the high logic level of the output voltage DIBU becomes about 0.9V, as shown in FIG. 7.

When 0V is applied to the gates of NMOS transistors N3 and N4 and PMOS transistors P4 and P5 of the level ascending/descending part 42, then NMOS transistors N3 and N4 turn off and the PMOS transistors P4 and P5 turn on. As a result, the output voltage drops, but does not drop to 0V. It drops to the threshold voltage of PMOS transistors P4 and P5 and the output voltage at DIBU becomes about 0.35V, as shown in FIG. 7.

As explained above, if the input signal is applied to the level ascending/descending parts 42 and 44 in FIG. 4, then the low logic level of the input signal is raised to the appropriate internal high logic level, and the high logic level of the input signal is lowered to the appropriate internal low logic level.

Since the operation of the level ascending/descending part 44 is the same as the operation of the level ascending/descending part 42, the explanation of the operation of the level ascending/descending part 42 can be used to understand the operation of the level ascending/descending part 44.

Furthermore, even though only three cases for the operation of the level ascending and descending parts of the invention have been illustrated and discussed in the context of FIGS. 5, 6 and 7, the level of a signal can be converted in the same manner for other input voltage signal levels.

The level ascending/descending parts 42 and 44, therefore, perform their operation so that signals with various input voltage levels can be converted and outputted as signals with normalized voltage levels. The sense amplifier 46 then operates upon the signals to amplify the voltage levels and output them as internal voltage logic level signals.

Figure 8:
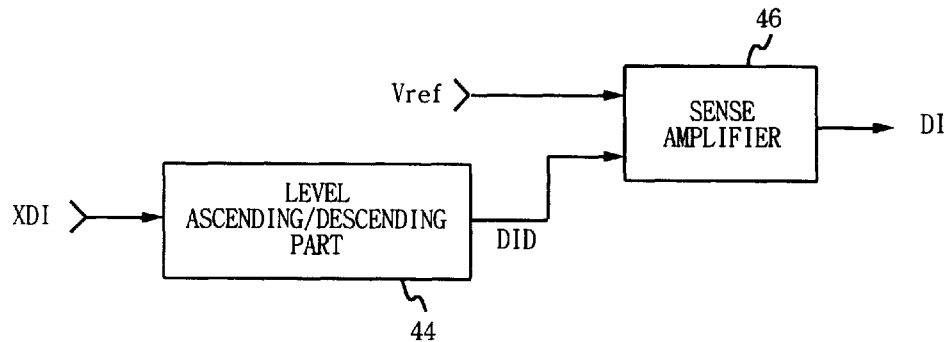
FIG. 8 shows a block diagram of a second embodiment of a level shifter according to the present invention.

FIG. 8 shows a block diagram of another embodiment of a level shifter according to the present invention. The structure in FIG. 8 is obtained by eliminating inverter 40 in FIG. 3 and replacing the output signal DIBU from level ascending/descending part 42 with reference voltage Vref. The same reference numbers and symbols are therefore used to identify sense amplifier 46 and level ascending/descending part 44 in FIG. 8.

Figure 9:
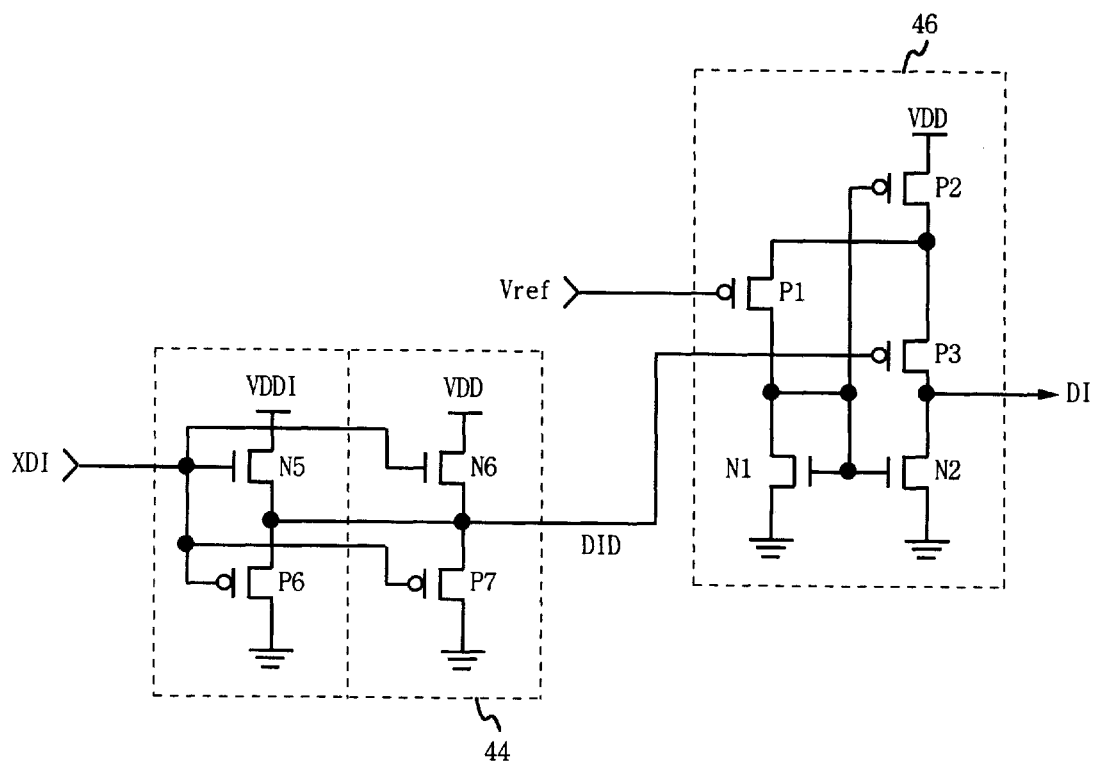
FIG. 9 shows the circuit of the level shifter shown in FIG. 8.

FIG. 9 illustrates the circuitry of the level shifter of FIG. 8. The structure of level ascending/descending part 44 and sense amplifier 46 of FIG. 8 is the same as that of the level ascending/descending part 44 and the sense amplifier 46 in FIG. 3 and so the same reference numbers and symbols are used.

The operation of the level shifter of FIG. 8 will now be explained. The sense amplifier 46 in FIG. 8 generates an output signal at output terminal DI that has the appropriate internal voltage levels by amplifying the voltage difference between the reference voltage Vref and the output signal at DID of the level ascending/descending part 44. The level of the reference voltage Vref applied to sense amplifier 46 can be established at a middle level between the high logic level voltage and the low logic level voltage that are level-shifted as shown in FIGS. 5, 6 and 7.

Figure 2:
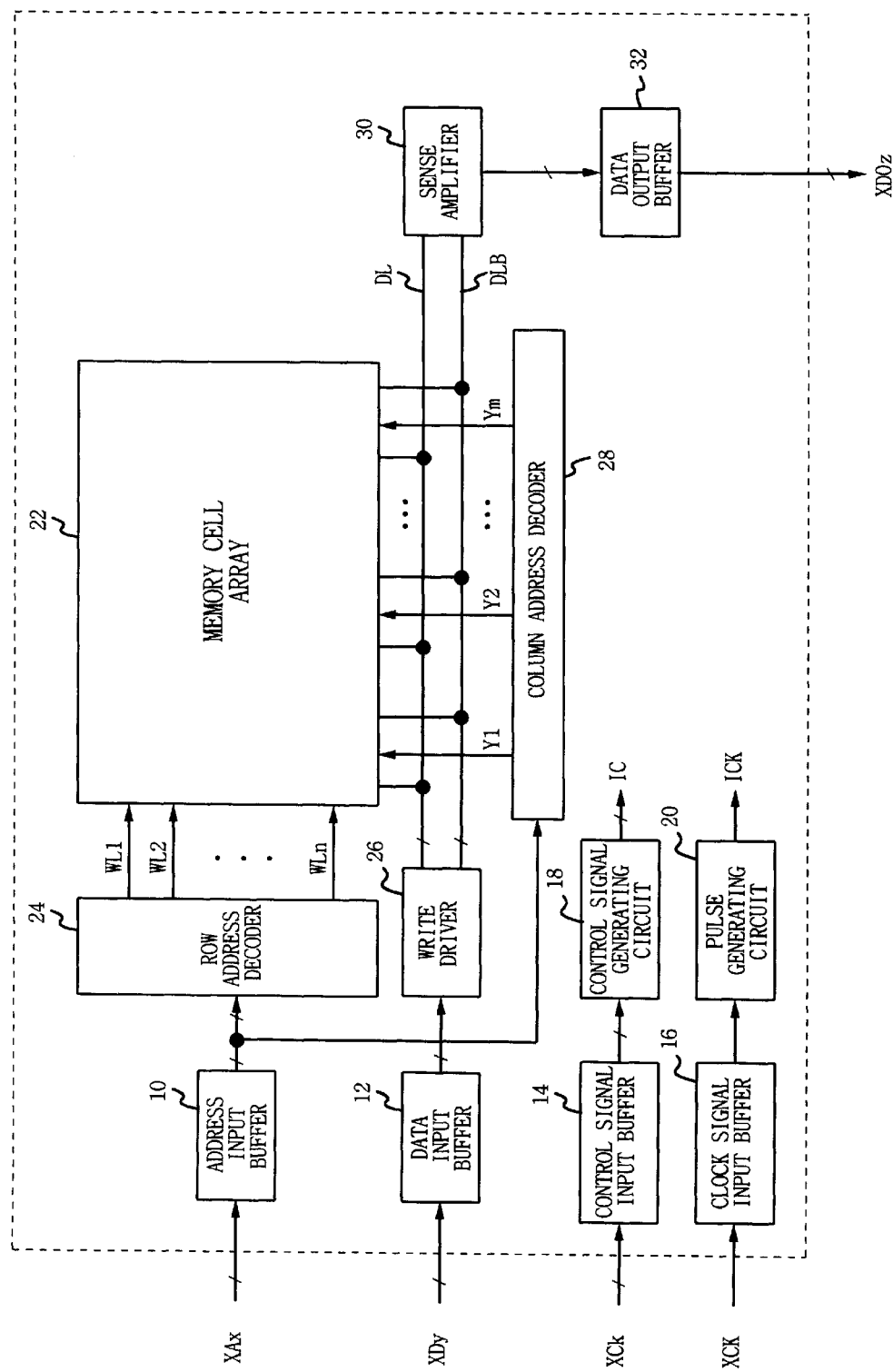
FIG. 2 shows a block diagram of a semiconductor memory device that uses the level shifter of FIG. 1.
Figure 10:
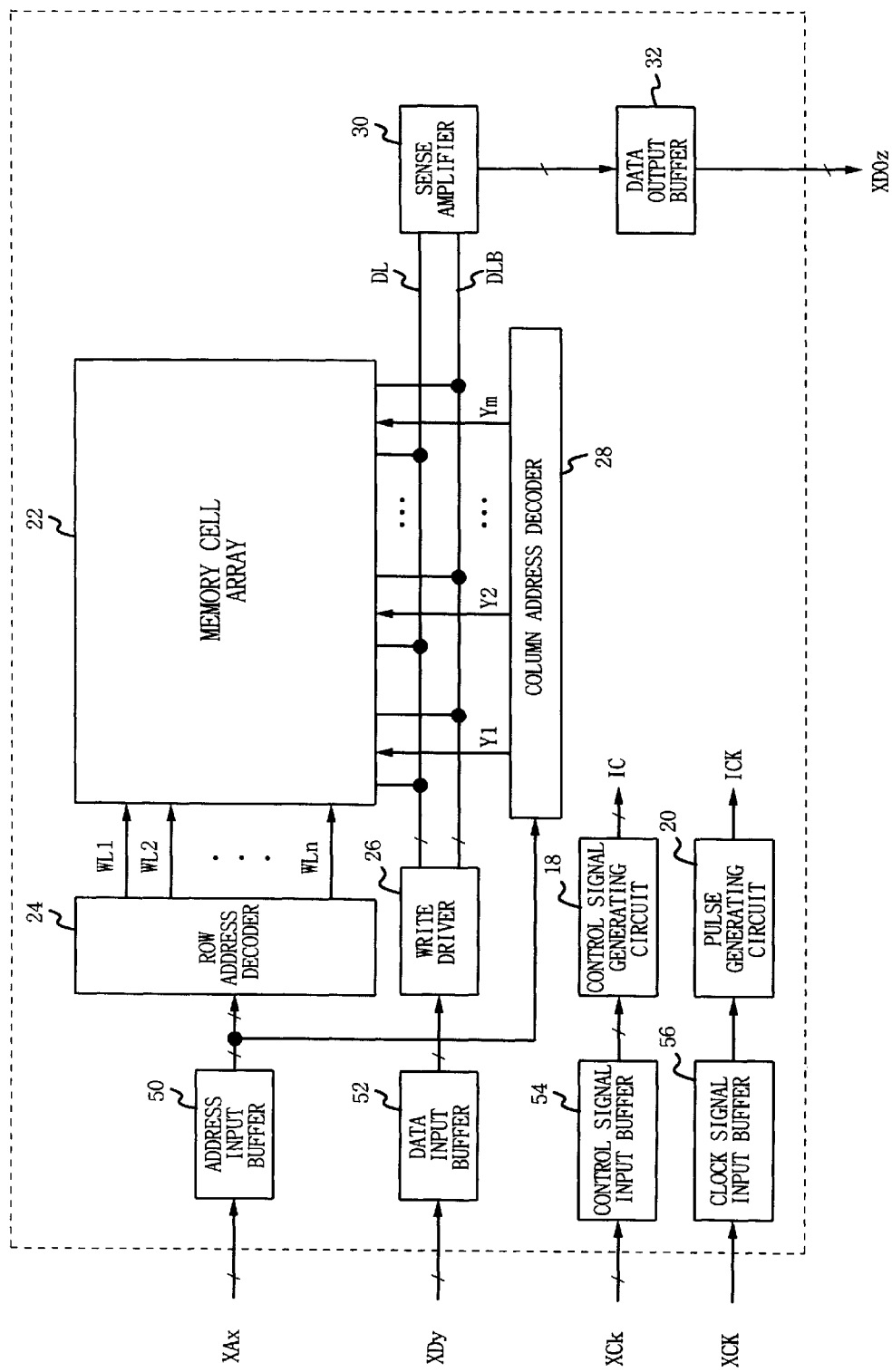
FIG. 10 shows the block diagram of a semiconductor memory device that uses the level shifter of the present invention.

FIG. 10 shows a block diagram of a semiconductor memory device that utilizes the level shifters, according to the present invention, shown in FIGS. 4 and 8. The memory device of FIG. 10 is much like the block diagram of the conventional device shown in FIG. 2 in terms of its structure. The differences between the memory devices of FIGS. 2 and 10 are only in the construction of address input buffer 50, data input buffer 52, control signal input buffer 54 and clock signal input buffer 56, and the reference numbers of these devices are therefore different.

Figure 11:
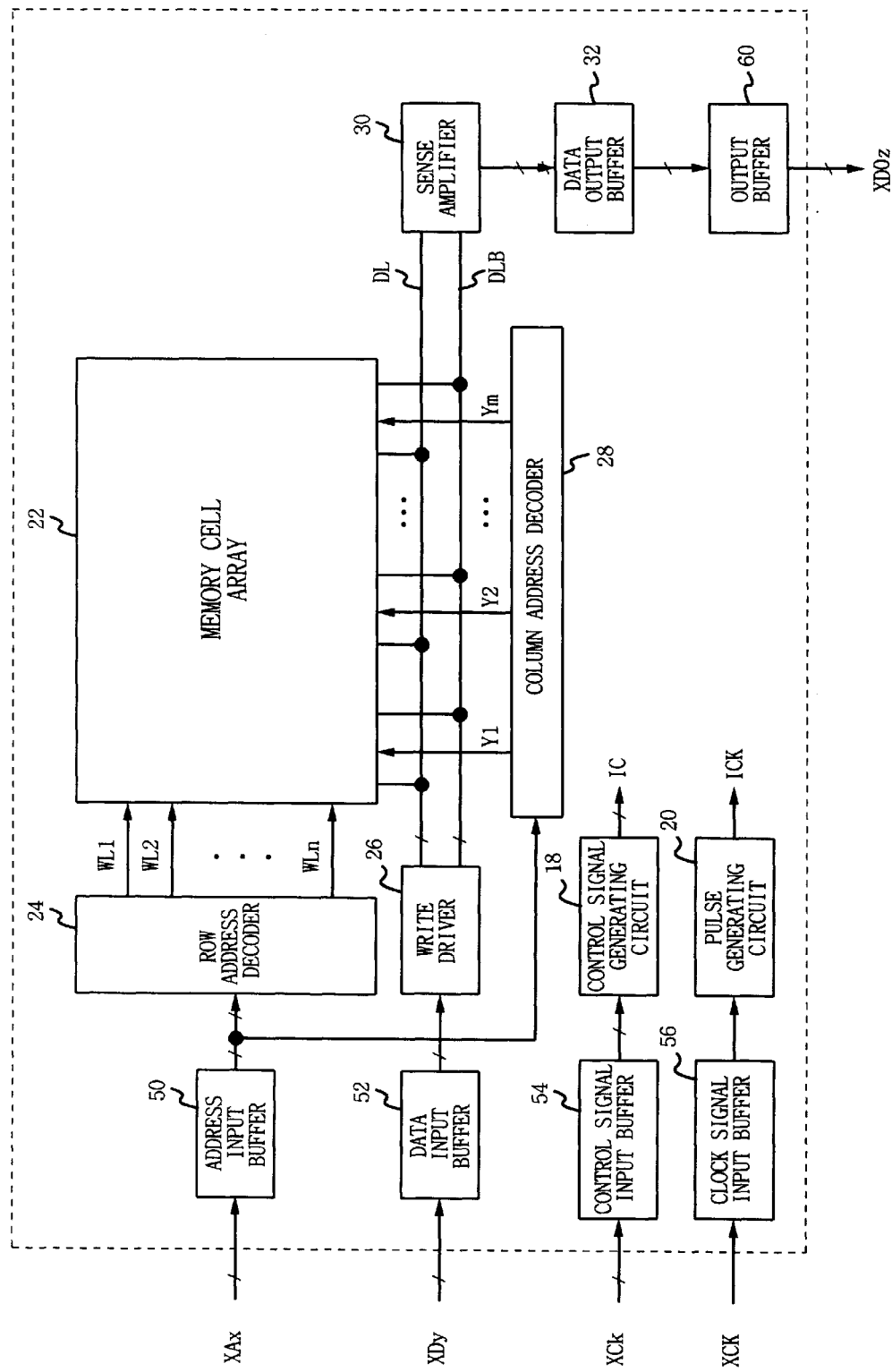
FIG. 11 shows the block diagram of another embodiment of a semiconductor memory device that uses the level shifter of the present invention.

FIG. 11 shows a block diagram of another semiconductor memory device that utilizes the level shifters, according to the present invention and shown in FIGS. 4 and 8, and is similar to the device of FIG. 10 except that it includes an output buffer 60.

The output buffer 60 receives a signal from the data input buffer 32 and converts it to the voltage logic levels for the external signal at output terminals XDOz.

In addition, the clock signal input buffer 56 in FIGS. 10 and 11 do not require an inverter 40 in the structure of the level shifter of FIGS. 3 and 4 to deal with the case when both clock signals and inverted clock signals can be externally input to the memory device. In other words, the inverted clock signals being externally inputted can be directly inputted through the level ascending/descending part 42.

Figure 12:
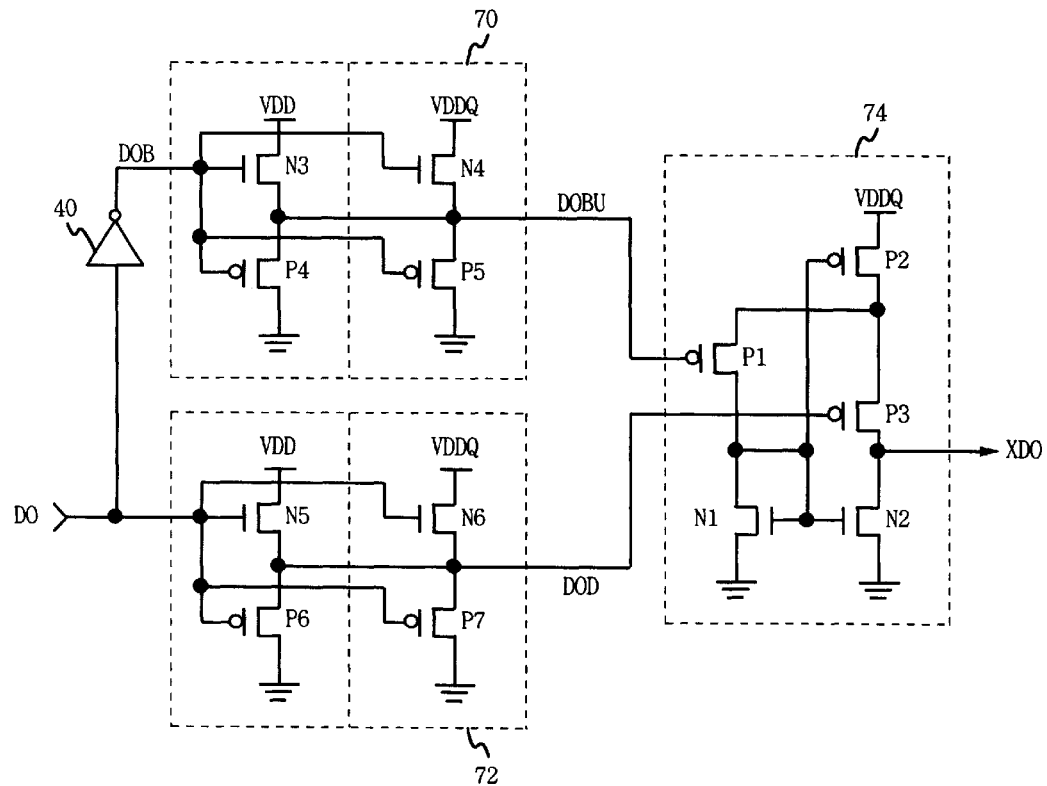
FIG. 12 shows the circuit of a first embodiment of the output buffer shown in FIG. 11.

FIG. 12 shows the circuit of the output buffer in FIG. 11, and it is much like the level shifter in FIG. 4 in terms of its structure. Accordingly, NMOS transistors N1, N2, N3, N4, N5 and N6 and the PMOS transistors P1, P2, P3, P4, P5, P6 and P7 are represented with the same reference symbols as the transistors in FIG. 4. However, signals XDI, XDIB, DIBU, DID, DI in FIG. 4 correspond to the signals DO, DOB, DOBU, DOD, XDO. Also, the external supply voltage terminal VDDI is replaced by the internal supply voltage VDD, and the internal supply voltage terminal VDD is replaced by an output supply voltage terminal VDDQ.

The level ascending/descending parts in FIG. 12 operate in the same manner as the level ascending/descending parts in FIG. 4. So, even if the internal supply voltage applied to VDD changes, it can be converted to the external supply voltage level externally applied to VDDQ.

Figure 1:
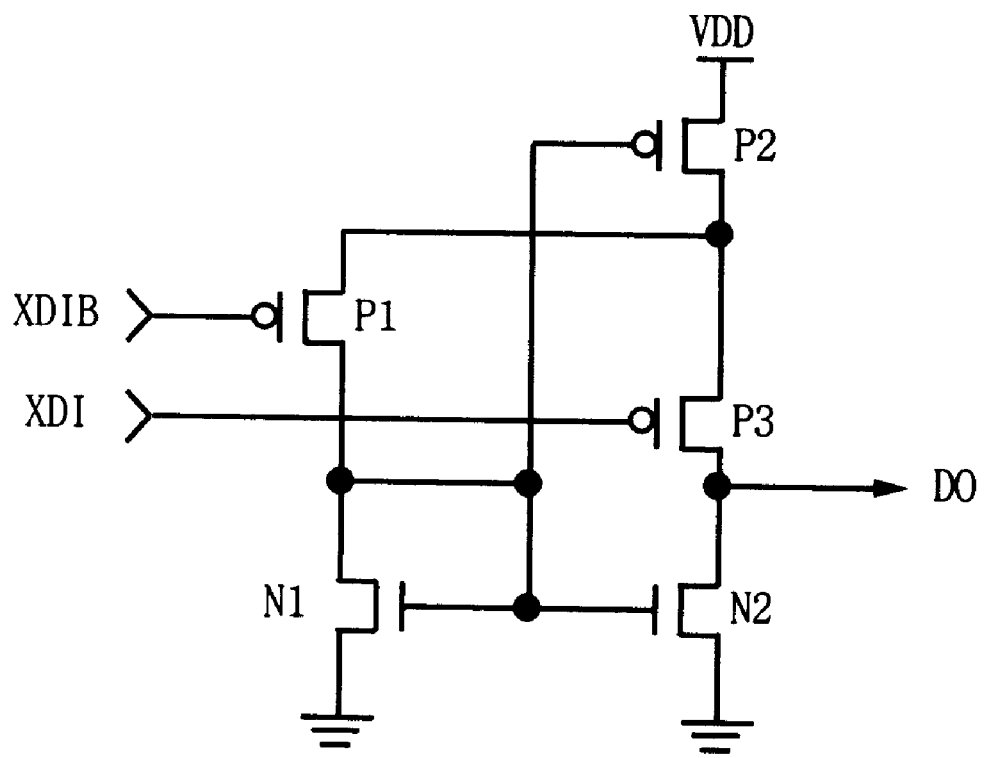
FIG. 1 shows a circuit for a conventional level shifter.
Figure 13:
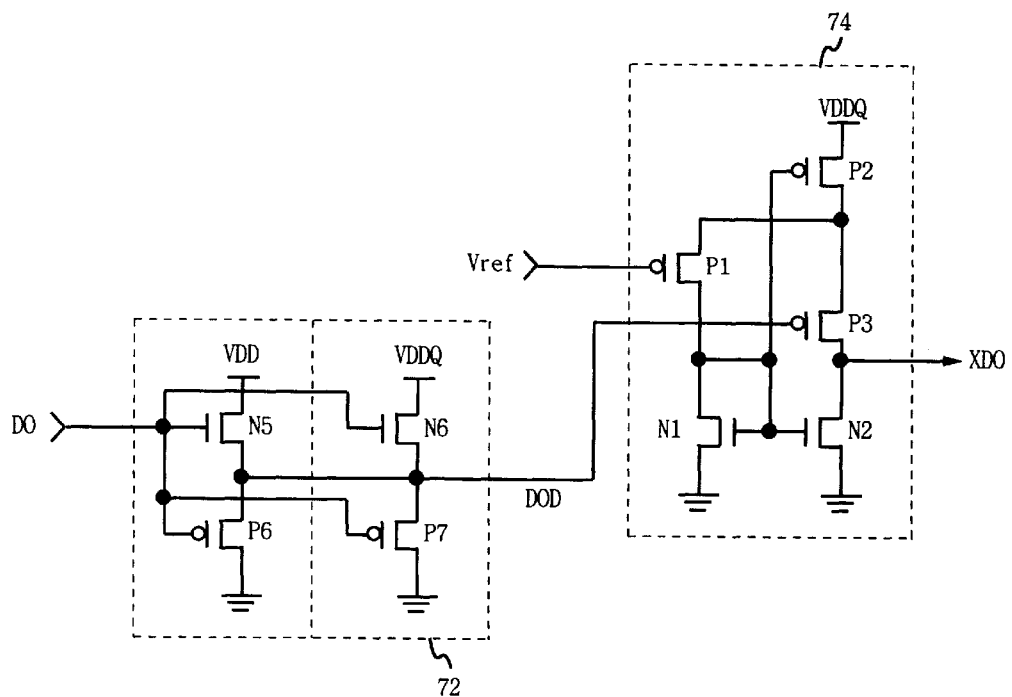
FIG. 13 shows the circuit of a second embodiment of the output buffer shown in FIG. 11.

FIG. 13 shows another embodiment of a circuit for the output buffer 60 in FIG. 1. This circuit is similar in structure to the level shifter shown in FIG. 9. In FIG. 13, NMOS transistors N1, N2, N5 and N6 and PMOS transistors P1, P2, P3, P6 and P7 are represented using the same reference numbers as the transistors in FIG. 4. However, the signals XDI, DID, DI in FIG. 9 are replaced by signals DO, DOD, XDO in FIG. 13. The internal supply voltage terminal VDDI is replaced by internal supply voltage terminal VDD and the internal supply voltage terminal VDD is replaced by the output supply voltage terminal VDDQ.

The level ascending/descending parts in FIG. 13 operate in the same manner as the level ascending/descending parts in FIG. 9. So, even if the internal supply voltage level applied to VDD changes, it can be converted to the output supply voltage externally applied to VDDQ.

Consequently, the semiconductor memory device shown in FIG. 11 can, even if the voltage levels of the input signals change, convert the externally applied signal to the internal voltage logic levels of the device. The semiconductor memory device shown in FIG. 10 can not only convert incoming signals having various voltage logic levels, but can also convert outgoing signals from the internal voltage logic levels to the external voltage logic levels.

The resulting semiconductor memory device according to the present invention can therefore be conveniently incorporated into a variety of systems having different voltage logic levels.

The level shifter of the present invention can convert an input signal that can have various voltage logic levels into a signal having a normalized voltage level differential. The semiconductor memory device that incorporates the level shifter can then convert the normalized voltage level differential into internal voltage logic levels. In addition, the semiconductor device, using the level shifter, can convert internal signals to the voltage logic levels of the system external to the memory device. The present invention thus provides a convenient interface between memory devices and the systems that use the devices.

While the present invention has been described and illustrated herein with reference to the preferred embodiments thereof, it will be understood by those skilled in the art that various changes in form and detail may be made therein without departing from the spirit and scope of the invention.

What is claimed is:

1. A level shifter circuit comprising:

first and second level ascending/descending means for outputting first and second output signals by descending a high logic level of an input signal and an inverse signal and by ascending a low logic level after an input signal and a reverse input signal are respectively inputted; and sense amplifying means for amplifying a level difference between the first and second level ascending/descending means and for generating a third output signal with a regular level, wherein the first level ascending/descending means includes:

first means for outputting the first output signal by descending the high logic level of an input signal and by ascending the low level after a voltage of the high logic level of the input signal is applied as the supply voltage, second means for outputting the first output signal by descending the high level of the input signal and by ascending the low level after the voltage of the high logic level of the third output signal is applied as the supply voltage, first pull-up means for generating the first output signal by responding to the input signal of the high logic level after the voltage of the high logic level of the input signal is applied as the supply voltage, and first pull-down means connected to a ground voltage and for generating the first output signal by responding to the input signal of the low logic level, wherein the first pull-up means includes a first NMOS transistor with a source connected to a first output voltage generating terminal, a drain in which the voltage of the high logic level of the input signal is applied as the supply voltage, and a gate in which the input signal is applied.

2. A level shifter circuit comprising:

first and second level ascending/descending means for outputting first and second output signals by descending a high logic level of an input signal and an inverse signal and by ascending a low logic level after an input signal and a reverse input signal are respectively inputted; and sense amplifying means for amplifying a level difference between the first and second level ascending/descending means and for generating a third output signal with a regular level, wherein the first level ascending/descending means includes:

first means for outputting the first output signal by descending the high logic level of an input signal and by ascending the low level after a voltage of the high logic level of the input signal is applied as the supply voltage, second means for outputting the first output signal by descending the high level of the input signal and by ascending the low level after the voltage of the high logic level of the third output signal is applied as the supply voltage, first pull-up means for generating the first output signal by responding to the input signal of the high logic level after the voltage of the high logic level of the input signal is applied as the supply voltage, and first pull-down means connected to a ground voltage and for generating the first output signal by responding to the input signal of the low logic level, wherein the first pull-down means includes a first PMOS transistor with a source connected to the first output voltage generating terminal, a drain connected to a ground voltage, and a gate in which the input signal is applied.

3. A level shifter circuit comprising:

first and second level ascending/descending means for outputting first and second output signals by descending a high logic level of an input signal and an inverse signal and by ascending a low logic level after an input signal and a reverse input signal are respectively inputted; and sense amplifying means for amplifying a level difference between the first and second level ascending/descending means and for generating a third output signal with a regular level, wherein the first level ascending/descending means includes:

first means for outputting the first output signal by descending the high logic level of an input signal and by ascending the low level after a voltage of the high logic level of the input signal is applied as the supply voltage, second means for outputting the first output signal by descending the high level of the input signal and by ascending the low level after the voltage of the high logic level of the third output signal is applied as the supply voltage, wherein the second means includes:

second pull-up means for generating the first output signal by responding to the input signal of the high logic level after the voltage of the high logic level of the third output signal is applied as the supply voltage; and second pull-down means connected to a ground voltage and for generating the first output signal by responding to the input signal of the low logic level.

4. The level shifter in accordance with claim 3, wherein the second pull-up means includes a second NMOS transistor with a source connected to the first output voltage generating terminal, a drain in which the voltage of the high logic level of the third output signal is applied as the supply voltage, and a gate in which the input signal is applied.

5. The level shifter in accordance with claim 3, wherein the second pull-down means includes a second PMOS transistor with a drain connected to a ground voltage, a source connected to a first output voltage generating terminal, and a gate in which the input signal is applied.

6. A level shifter circuit comprising:

first and second level ascending/descending means for outputting first and second output signals by descending a high logic level of an input signal and an inverse signal and by ascending a low logic level after an input signal and a reverse input signal are respectively inputted; and sense amplifying means for amplifying a level difference between the first and second level ascending/descending means and for generating a third output signal with a regular level, wherein the second level ascending/descending means includes:

third means for outputting the first output signal by descending the high logic level of the input signal and by ascending the low logic level after the voltage of the high logic level of the input signal is applied as the supply voltage; and fourth means for outputting the first output signal by descending the high logic level of the input signal and by ascending the low logic level after the voltage of the high logic level of the third output signal is applied as the supply voltage.

7. The level shifter in accordance with claim 6, wherein the third means includes:

third pull-up means for generating the second output signal by responding to the inverted input signal of the high logic level after the voltage of the high logic level of the input signal is applied as the supply voltage; and third pull-down means connected to a ground voltage and for generating the second output signal by responding to the inverted input signal of the low logic level.

8. The level shifter in accordance with claim 7, wherein the third pull-up means includes a third NMOS transistor with a source connected to a second output voltage generating terminal, a drain in which the voltage of the high level of the input signal is applied as the supply voltage, and a gate in which the inverted input signal is applied.

9. The level shifter in accordance with claim 7, wherein the third pull-down means includes a third PMOS transistor with a source connected to a second output voltage generating terminal, a drain connected to a ground voltage, and a gate in which the inverted input signal is applied.

10. The level shifter in accordance with claim 6, wherein the fourth means includes:

fourth pull-up means for generating the second output signal by responding to the inverted input signal of the high logic level after the voltage of the high logic level of the third output signal is applied as the supply voltage; and fourth pull-down means connected to a ground voltage and for generating the second output signal by responding to the inverted input signal of the low logic level.

11. The level shifter in accordance with claim 10, wherein the fourth pull-up means includes a fourth NMOS transistor with a source connected to the second output voltage generating terminal, a drain in which the voltage of the high logic level of the third output signal is applied as the supply voltage, and a gate in which the inverted input signal is applied.

12. The level shifter in accordance with claim 10, wherein the fourth pull-down means includes a third PMOS transistor with a source connected to the second output voltage generating terminal, a drain connected to a ground voltage, and a gate in which the inverted input signal is applied.

13. The level shifter in accordance with claim 6, wherein the sense amplifier includes:

a fifth PMOS transistor with a source in which the voltage of the high logic level of the third output signal is applied as the supply voltage;

a sixth PMOS transistor with a Source connected to the drain of the fifth PMOS transistor and with a gate in which the output signal of the second level ascending/descending means is applied;

a seventh PMOS transistor with a drain connected to the output terminal, a gate in which the output signal of the first level ascending/descending means is applied, and a source connected to the drain of the fifth PMOS transistor;

a fifth NMOS transistor with a source connected to the ground voltage, a gate and a drain commonly connected to the drain of the sixth PMOS transistor; and a sixth NMOS transistor with a source connected to the ground voltage, a gate commonly connected to the gate of the fifth PMOS transistor and the fifth NMOS transistor, and a drain connected to the drain of the seventh PMOS transistor.

14. A semiconductor memory device having a plurality of signal input terminals, wherein the signal input tenninals comprise:

first and second level ascending/descending means for outputting first and second output signals by descending the high logic level of an input signal and the inverted input signal and by ascending the low logic level after a signal being inputted from outside and the inverted signal of the signal are inputted; and sense amplifying means for generating a third output signal of a regular level after amplifying a level difference of the first and second output signals.

15. The semiconductor memory device in accordance with claim 14, wherein clock signals being inputted from outside and inverted clock signals being inputted from outside are inputted to the first and second level ascending/descending means.

16. The semiconductor memory device in accordance with claim 14, wherein the voltage of the high logic level of the third output signal is an internal supply voltage of the semiconductor memory device.

17. The semiconductor memory device in accordance with claim 14, wherein the first level ascending/descending means includes:

first means for outputting the first output signal by descending the high logic level of the input signal and by ascending the low logic level after the voltage of the high logic level of the input signal is applied as the supply voltage; and second means for outputting the first output signal by descending the high logic level of the input signal and by ascending the low logic level after the voltage of the high logic level of the third output signal is applied as the supply voltage.

18. The semiconductor memory device in accordance with claim 17, wherein the first means includes:

first pull-up means for generating the first output signal by responding to the input signal of the high logic level after the voltage of the high logic level of the input signal is applied as the supply voltage; and first pull-down means connected to a ground voltage and for generating the first output signal by responding to the input signal of the low logic level.

19. The semiconductor memory device in accordance with claim 17, wherein the second means includes:

second pull-up means for generating the first output signal by responding to the input signal of the high logic level after the voltage of the high logic level of the third output signal is applied as the supply voltage; and second pull-down means connected to a ground voltage and for generating the first output signal by responding to the input signal of the low logic level.

20. The semiconductor memory device in accordance with claim 14, wherein the second level ascending/descending means includes:

third means for outputting the second output signal by descending the high logic level of the input signal and by ascending the low logic level after the voltage of the high logic level of the input signal is applied as the supply voltage; and fourth means for outputting the second output signal by descending the high logic level of the inverted input signal and by ascending the low logic level after the voltage of the high logic level of the third output signal is applied as the supply voltage.

21. The semiconductor memory device in accordance with claim 20, wherein the third means includes:

third pull-up means for generating the second output signal by responding to the inverted input signal of the high logic level after the voltage of the high logic level of the input signal is applied as the supply voltage; and third pull-down means connected to a ground voltage and for generating the second output signal by responding to the inverted input signal of the low logic level.

22. The semiconductor memory device in accordance with claim 20, wherein the fourth means includes:

fourth pull-up means for generating the second output signal by responding to the inverted input signal of the high logic level after the voltage of the high logic level of the third output signal is applied as the supply voltage; and fourth pull-down means connected to a ground voltage and for generating the second output signal by responding to the inverted input signal of the low logic level.

23. The semiconductor memory device in accordance with claim 17, wherein the sense amplifier includes:

a first PMOS transistor with a source in which the voltage of the high logic level of the third output signal is applied as the supply voltage;

a second PMOS transistor with a source connected to the drain of the first PMOS transistor and with a gate in which the output signal of the second level ascending/descending means is applied;

a third PMOS transistor with a drain connected to the third output terminal, a gate in which the output signal of the first level ascending/descending means is applied, and a source connected to the drain of the first PMOS transistor;

a first NMOS transistor with a source connected to the ground voltage, a gate and a drain commonly connected to the drain of the second PMOS transistor; and a second NMOS transistor with a source connected to the ground voltage, a gate commonly connected to the gate of the first PMOS transistor and the first NMOS transistor, and a drain connected to the drain of the third PMOS transistor.

24. A semiconductor memory device having a plurality of signal input terminals and a plurality of signal output terminals, wherein each of the signal input terminals includes:

first and second level ascending/descending means for generating first and second output signals by descending the high logic level of the input signal and the inverted input signal and by ascending the low logic level after the signal being inputted from outside and an inverted signal of the signal are respectively inputted; and input sense amplifying means for generating a third output signal of a regular level by amplifying a level difference of the first and second output signals of the first and second level ascending/descending means, and wherein each of the signal output terminals includes:

third and fourth level ascending/descending means for generating fourth and fifth output signals by descending the high logic level of the third output signal and by ascending the low logic level after a third output signal being inputted from the device and a inverted third output signal are inputted; and output sense amplifying means for generating a sixth output signal of a regular level by amplifying a level difference of the fourth and fifth output signals of the third and fourth level ascending/descending means.

25. The semiconductor memory device in accordance with claim 24, wherein clock signals and inverted clock signals being inputted from outside are outputted to the first and second level ascending/descending means.

26. The semiconductor memory device in accordance with claim 24, wherein the voltage of the high logic level of the third output signal is an internal supply voltage of the semiconductor memory device.

27. The semiconductor memory device in accordance with claim 24, wherein the first level ascending/descending means includes:

first means for outputting the first output signal by descending the high logic level of the input signal and by ascending the low logic level after the voltage of the high logic level of the input signal is applied as the supply voltage; and second means for outputting the first output signal by descending the high logic level of the input signal and by ascending the low logic level after the voltage of the high logic level of the third output signal is applied as the supply voltage.

28. The semiconductor memory device in accordance with claim 27, wherein the first means includes:

first pull-up means for generating the first output signal by responding to the input signal of the high logic level after the voltage of the high logic level of the input signal is applied as the supply voltage; and first pull-down means connected to a ground voltage and for generating the first output signal by responding to the input signal of the low logic level.

29. The semiconductor memory device in accordance with claim 27, wherein the second means includes:

second pull-up means for generating the first output signal by responding to the input signal of the high logic level after the voltage of the high logic level of the third output signal is applied as the supply voltage; and second pull-down means connected to a ground voltage and for generating the first output signal by responding to the input signal of the low logic level.

30. The semiconductor memory device in accordance with claim 24, wherein the second level ascending/descending means includes:

third means for outputting the second output signal by descending the high logic level of the inverted input signal and by ascending the low logic level after the voltage of the high logic level of the input signal is applied as the supply voltage; and fourth means for outputting the second output signal by descending the high logic level of the inverted input signal and by ascending the low logic level after the voltage of the high logic level of the third output signal is applied as the supply voltage.

31. The semiconductor memory device in accordance with claim 30, wherein the third means includes:

third pull-up means for generating the second output signal by responding to the inverted input signal of the high logic level after the voltage of the high logic level of the input signal is applied as the supply voltage; and third pull-down means connected to a ground voltage and for generating the second output signal by responding to the inverted input signal of the low logic level.

32. The semiconductor memory device in accordance with claim 30, wherein the fourth means includes:

fourth pull-up means for generating the second output signal by responding to the inverted input signal of the high logic level after the voltage of the high logic level of the third output signal is applied as the supply voltage; and fourth pull-down means connected to a ground voltage and for generating the second output signal by responding to the inverted input signal of the low logic level.

33. The semiconductor memory device in accordance with claim 27, wherein the sense amplifier includes:

a first PMOS transistor with a source in which the voltage of the high logic level of the third output signal is applied as the supply voltage;

a second PMOS transistor with a source connected to the drain of the first PMOS transistor and with a gate in which the output signal of the second level ascending/descending means is applied;

a third PMOS transistor with a drain connected to the third output signal terminal, a gate in which the output signal of the first level ascending/descending means is applied, and a source connected to the drain of the first PMOS transistor;

a first NMOS transistor with a source connected to the ground voltage, a gate and a drain commonly connected to the drain of the second PMOS transistor; and a second NMOS transistor with a source connected to the ground voltage, a gate commonly connected to the gate of the first PMOS transistor and the first NMOS transistor, and a drain connected to the drain of the third PMOS transistor.

34. The semiconductor memory device in accordance with claim 24, wherein the third level ascending/descending means includes:

fifth means for outputting the fourth output signal by descending the high logic level of the input signal and by ascending the low logic level after the voltage of the high logic level of the third output signal is applied as the supply voltage; and sixth means for outputting the fourth output signal by descending the high logic level of the input signal and by ascending the low logic level after the voltage of the high logic level of the sixth output signal is applied as the supply voltage.

35. The semiconductor memory device in accordance with claim 34, wherein the fifth means includes:

fifth pull-up means for generating the fourth output signal by responding to the third output signal of the high logic level after the voltage of the high logic level of the third output signal is applied as the supply voltage; and fifth pull-down means connected to the ground voltage and for generating the fourth output signal by responding to the third output signal of the low logic level.

36. The semiconductor memory device in accordance with claim 34, wherein the sixth means includes:

sixth pull-up means for generating the fifth output signal by responding to the input signal of the high logic level after the voltage of the high logic level of the sixth output signal is applied as the supply voltage; and sixth pull-down means connected to a ground voltage and for generating the fifth output signal by responding to the sixth output signal of the low logic level.

37. The semiconductor memory device in accordance with claim 34, wherein the fourth level ascending/descending means includes:

seventh means for outputting the fifth output signal by descending the high logic level of the input signal and by ascending the low logic level after the voltage of the high logic level of the third output signal is applied as the supply voltage; and eighth means for outputting the fifth output signal by ascending the high logic level of the third inverted output signal and by ascending the low logic level after the voltage of the high logic level of the sixth output signal is applied as the supply voltage.

38. The semiconductor memory device in accordance with claim 37, wherein the seventh means includes:

seventh pull-up means for generating the fifth output signal by responding to the third inverted output signal of the high logic level after the voltage of the high logic level of the third output signal is applied as the supply voltage; and seventh pull-down means connected to a ground voltage and for generating the fifth output signal by responding to the third inverted output signal of the low logic level.

39. The semiconductor memory device in accordance with claim 37, wherein the eighth means includes:

eighth pull-up means for generating the fifth output signal by responding to the third inverted output signal of the high logic level after the voltage of the high logic level of the sixth output signal is applied as the supply voltage; and eighth pull-down means connected to the ground voltage and for generating the fifth output signal by responding to the third inverted output signal of the low logic level.

40. The semiconductor memory device in accordance with claim 34, wherein the sense amplifier includes:

a fourth PMOS transistor with a source in which the voltage of the high logic level of the sixth output signal is applied as the supply voltage;

a fifth PMOS transistor with a source connected to the drain of the fourth PMOS transistor and with a gate in which the output signal of the fourth level ascending/descending means is applied;

a sixth PMOS transistor with a drain connected to the sixth output signal terminal, a gate in which the output signal of the third level ascending/descending means is applied, and a source connected to the drain of the fourth PMOS transistor;

a third NMOS transistor with a source connected to the ground voltage, a gate and a drain commonly connected to the drain of the fifth PMOS transistor; and a fourth NMOS transistor with a source connected to the ground voltage, a gate commonly connected to the gate of the sixth PMOS transistor and the third NMOS transistor, and a drain connected to the drain of the sixth PMOS transistor.

41. A level shifter comprising:

level ascending/descending means for generating a first output signal by descending the high logic level of the input signal and by ascending the low logic level after the input signal is inputted; and sense amplifying means for generating a second output signal of a regular level by amplifying a level difference of the first output signal and a reference voltage.

42. The level shifter in accordance with claim 41, wherein the level ascending/descending means includes:

first means for outputting the first output signal by descending the high logic level of the input signal and by ascending the low logic level after the voltage of the high logic level of the input signal is applied as the supply voltage; and second means for outputting the first output signal by descending the high logic level of the input signal and by ascending the low logic level after the voltage of the high logic level of the second output signal is applied as the supply voltage.

43. The -level shifter in accordance with claim 42, wherein the first means includes:

first pull-up means for generating the first output signal by responding to the input signal of the high logic level after the voltage of the high logic level of the input signal is applied as the supply voltage; and first pull-down means connected to the ground voltage and for generating the first output signal by responding to the input signal of the low logic level.

44. The level shifter in accordance with claim 42, wherein the second means includes:

second pull-up means for generating the first output signal by responding to the input signal of the high logic level after the voltage of the high logic level of the second output signal is applied as the supply voltage; and second pull-down means connected to a ground voltage and for generating the first output signal by responding to the input signal of the low logic level.

45. A semiconductor memory device having a plurality of signal input terminals, wherein each of the signal input terminals includes:

level ascending/descending means for generating a first output signal by descending the high logic level of the input signal and by ascending the low logic level after an input signal is inputted; and sense amplifying means for generating a second output signal of a regular level by amplifying a level difference of the first output signal of the level ascending/descending means and a reference voltage.

46. The semiconductor memory device in accordance with claim 45, wherein clock signals and inverted clock signals being inputted from outside are outputted to the level ascending/descending means.

47. The semiconductor memory device in accordance with claim 45, wherein the voltage of the high logic level of the second output signal is an internal supply voltage of the semiconductor memory device.

48. The semiconductor memory device in accordance with claim 45, wherein the level ascending/descending means includes:

first means for outputting the first output signal by descending the high logic level of the input signal and by ascending the low logic level after the voltage of the high logic level of the input signal is applied as the supply voltage; and second means for outputting the first output signal by descending the high logic level of the input signal and by ascending the low logic level after the voltage of the high logic level of the second output signal is applied as the supply voltage.

49. The semiconductor memory device in accordance with claim 48, wherein the first means includes:

first pull-up means for generating the first output signal by responding to the input signal of the high logic level after the voltage of the high logic level of the input signal is applied as the supply voltage; and first pull-down means connected to a ground voltage and for generating the first output signal by responding to the input signal of the low logic level.

50. The semiconductor memory device in accordance with claim 48, wherein the second means includes:

second pull-up means for generating the first output signal by responding to the input signal of the high logic level after the voltage of the high logic level of the second output signal is applied as the supply voltage; and second pull-down means connected to a ground voltage and for generating the first output signal by responding to the input signal of the low logic level.

51. A semiconductor memory device having a plurality of signal input terminals and a plurality of signal output terminals, wherein each of the signal input terminals includes:

first level ascending/descending means for generating a first output signal by descending the high logic level of the input signal and by ascending the low logic level after an input signal is inputted; and first sense amplifying means for generating a second output signal of a regular level by amplifying the level difference of the first output signal of the first level ascending/descending means and a first reference voltage level, wherein each of the signal output terminals includes:

second level ascending/descending means for generating a third output signal by descending the high logic level of a second output signal being outputted from the device and ascending the low logic level; and second sense amplifying means for generating a fourth output signal of a regular level by amplifying the level difference of a third output signal being outputted from the second level ascending/descending means and a second reference voltage level.

52. The semiconductor memory device in accordance with claim 51, wherein clock signals and inverted clock signals are outputted to the first level ascending/descending means.

53. The semiconductor memory device in accordance with claim 51, wherein the voltage of the high logic level of the second output signal is an internal supply voltage of the semiconductor memory device.

54. The semiconductor memory device in accordance with claim 51, wherein the first level ascending/descending means includes:

first means for outputting the first output signal by descending the high logic level of the input signal and by ascending the low logic level after the voltage of the high logic level of the input signal is applied as the supply voltage; and second means for outputting the first output signal by descending the high logic level of the input signal and by ascending the low logic level after the voltage of the high logic level of the second output signal is applied as the supply voltage.

55. The semiconductor memory device in accordance with claim 54, wherein the first means includes:

first pull-up means for generating a first output signal by responding to the input signal of the high logic level after the voltage of the high logic level of the input signal is applied as the supply voltage; and first pull-down means connected to a ground voltage and for generating the first output signal by responding to the input signal of the low logic level.

56. The semiconductor memory device in accordance with claim 54, wherein the second means includes:

second pull-up means for generating the first output signal by responding to the input signal of the high logic level after the voltage of the high logic level of the second output signal is applied as the supply voltage; and second pull-down means connected to a ground voltage and for generating the first output signal by responding to the input signal of the low logic level.

57. The semiconductor memory device in accordance with claim 51, wherein the second level ascending/descending means includes:

third means for outputting the third output signal by descending the high logic level of the input signal and by ascending the low logic level after the voltage of the high logic level of the second output signal is applied as the supply voltage; and fourth means for outputting the third output signal by descending the high logic level of the input signal and by ascending the low logic level after the voltage of the high logic level of the fourth output signal is applied as the supply voltage.

58. The semiconductor memory device in accordance with claim 57, wherein the third means includes:

third pull-up means for generating the third output signal by responding to the input signal of the high logic level and after the voltage of the high logic level of the second output signal is applied as the supply voltage;

third pull-down means for generating the third output signal by responding to the input signal of the low logic level and after being connected to the ground voltage.

59. The semiconductor memory device in accordance with claim 57, wherein the fourth means includes:

fourth pull-up means for generating the fourth output signal by responding to the input signal of the high logic level and after the voltage of the high logic level of the fourth output signal is applied as the supply voltage; and fourth pull-down means connected to the ground voltage and for generating the fourth output signal by responding to the input signal of the low logic level.

60. A method for level shifting an externally input signal to an internal signal, the method comprising the steps:

buffering the input signal relative to an external supply voltage of the input signal;

buffering the input signal relative to an internal supply voltage of the input signal;

combining the result of buffering the input signal relative to an external supply voltage and the result of buffering the input signal relative to an internal supply voltage to obtain a first output voltage;

inverting the input signal to obtain an inverted input signal;

buffering the inverted input signal relative to the external supply voltage of the input signal;

buffering the inverted input signal relative to the internal supply voltage of the input signal;

combining the result of buffering the inverted input signal relative to the external supply voltage and the result of buffering the inverted input signal relative to the internal supply voltage to obtain a second output voltage; and differentially amplifying the first and second output signals to generate the internal signal.

61. The method of claim 60, wherein:

the step of buffering the input signal relative to an external supply voltage includes pulling a high logic level of the input signal toward the external supply voltage and pulling a low logic level of the input signal toward a ground voltage;

the step of buffering the input signal relative to an internal supply voltage includes pulling the high logic level of the input signal toward the internal supply voltage and pulling the low logic level of the input signal toward the ground voltage;

the step of buffering the inverted input signal relative to the external supply voltage includes pulling the high logic level of the inverted input signal toward the external supply voltage and pulling the low logic level of the inverted input signal toward the ground voltage; and the step of buffering the inverted input signal relative to the internal supply voltage of the input signal includes pulling the high logic level of the inverted input signal toward the internal supply voltage and pulling the low logic level of the inverted input signal toward the ground voltage.

62. The level shifter in accordance with claim 6, wherein the sense amplifier includes:

a fifth PMOS transistor with a source in which the voltage of the high logic level of the third output signal is applied as the supply voltage;

a sixth PMOS transistor with a source connected to the drain of the fifth PMOS transistor and with a gate in which the output signal of the second level ascending/descending means is applied;

a seventh PMOS transistor with a drain connected to the output terminal, a gate in which the output signal of the first level ascending/descending means is applied, and a source connected to the drain of the fifth PMOS transistor;

a fifth NMOS transistor with a source connected to the ground voltage, a gate and a drain commonly connected to the drain of the sixth PMOS transistor; and a sixth NMOS transistor with a source connected to the ground voltage, a gate commonly connected to the gate of the fifth PMOS transistor and the fifth NMOS transistor, and a drain connected to the drain of the seventh PMOS transistor.

63. The semiconductor memory device in accordance with claim 20, wherein the sense amplifier includes:

a first PMOS transistor with a source in which the voltage of the high logic level of the third output signal is applied as the supply voltage;

a second PMOS transistor with a source connected to the drain of the first PMOS transistor and with a gate in which the output signal of the second level ascending/descending means is applied;

a third PMOS transistor with a drain connected to the third output terminal, a gate in which the output signal of the first level ascending/descending means is applied, and a source connected to the drain of the first PMOS transistor;

a first NMOS transistor with a source connected to the ground voltage, a gate and a drain commonly connected to the drain of the second PMOS transistor; and a second NMOS transistor with a source connected to the ground voltage, a gate commonly connected to the gate of the first PMOS transistor and the first NMOS transistor, and a drain connected to the drain of the third PMOS transistor.

64. The semiconductor memory device in accordance with claim 30, wherein the sense amplifier includes:

a first PMOS transistor with a source in which the voltage of the high logic level of the third output signal is applied as the supply voltage;

a second PMOS transistor with a source connected to the drain of the first PMOS transistor and with a gate in which the output signal of the second level ascending/descending means is applied;

a third PMOS transistor with a drain connected to the third output signal terminal, a gate in which the output signal of the first level ascending/descending means is applied, and a source connected to the drain of the first PMOS transistor;

a first NMOS transistor with a source connected to the ground voltage, a gate and a drain commonly connected to the drain of the second PMOS transistor; and a second NMOS transistor with a source connected to the ground voltage, a gate commonly connected to the gate of the first PMOS transistor and the first NMOS transistor, and a drain connected to the drain of the third PMOS transistor.

65. The semiconductor memory device in accordance with claim 37, wherein the sense amplifier includes:

a fourth PMOS transistor with a source in which the voltage of the high logic level of the sixth output signal is applied as the supply voltage;

a fifth PMOS transistor with a source connected to the drain of the fourth PMOS transistor and with a gate in which the output signal of the fourth level ascending/descending means is applied;

a sixth PMOS transistor with a drain connected to the sixth output signal terminal, a gate in which the output signal of the third level ascending/descending means is applied, and a source connected to the drain of the fourth PMOS transistor;

a third NMOS transistor with a source connected to the ground voltage, a gate and a drain commonly connected to the drain of the fifth PMOS transistor; and a fourth NMOS transistor with a source connected to the ground voltage, a gate commonly connected to the gate of the sixth PMOS transistor and the third NMOS transistor, and a drain connected to the drain of the sixth PMOS transistor.

* * * * *

UNITED STATES PATENT AND TRADEMARK OFFICE
CERTIFICATE OF CORRECTION

PATENT NO.    : 6,166,969
DATED         : December 26, 2000
INVENTOR(S)   : Song et al.

It is certified that error appears in the above-identified patent and that said Letters Patent is hereby corrected as shown below:

Column 9,
Line 41, "Fig. 1" should read -- Fig. 11 --;

Column 12,
Line 36, "high level" should read -- 'high level' --.

Signed and Sealed this

Fourth Day of February, 2003

JAMES E. ROGAN
*Director of the United States Patent and Trademark Office*